United States Patent
Husher

(10) Patent No.: US 6,822,290 B2
(45) Date of Patent: Nov. 23, 2004

(54) TRUNCATED POWER ENHANCED DRIFT LATERAL DMOS DEVICE WHICH INCLUDES A GROUND STRAP

(75) Inventor: John Durbin Husher, Los Altos Hills Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/763,640

(22) Filed: Jan. 22, 2004

(65) Prior Publication Data

US 2004/0169208 A1 Sep. 2, 2004

Related U.S. Application Data

(62) Division of application No. 10/286,160, filed on Oct. 31, 2002.

(51) Int. Cl.[7] .............................................. H01L 29/76
(52) U.S. Cl. ...................................... 257/335; 257/337
(58) Field of Search ................................. 257/335, 337, 257/331, 342, 343, 334, 329; 438/270, 138

(56) References Cited

U.S. PATENT DOCUMENTS

| 5,682,048 A | * 10/1997 | Shinohara et al. .......... 257/342 |
| 5,719,411 A | 2/1998 | Ajit |
| 5,767,546 A | 6/1998 | Williams et al. |
| 6,525,372 B2 | 2/2003 | Baliga |

* cited by examiner

*Primary Examiner*—David Nelms
*Assistant Examiner*—Thinh T Nguyen
(74) *Attorney, Agent, or Firm*—Sawyer Law Group LLP

(57) ABSTRACT

A method and system for providing a power enhanced lateral DMOS device is disclosed. The method system comprise providing a semiconductor substrate with a plurality of source/body structures thereon. The method and system further comprise providing a slot in the semiconductor substrate between the plurality of source/body structures to provide a truncated source; and providing a metal within the slot to provide a ground strap device.

7 Claims, 6 Drawing Sheets

Metal Shorted Slot to Ground, Source, and Body (drain not shown)

Standard LDMOS with Enhanced Drift

Split Cell - Distance Z Equals
Standard Cell Dimension (drain not shown)

Metal Shorted Slot to Ground, Source, and Body (drain not shown)

TRUNCATED POWER ENHANCED DRIFT LATERAL DMOS DEVICE WHICH INCLUDES A GROUND STRAP

This application is a Divisonal of Ser. No. 10/286,160 filed Oct. 31, 2002.

FIELD OF THE INVENTION

The present invention relates generally to a Power Enhanced Drift Lateral DMOS device and more particularly to a Truncated Power Enhanced Drift Lateral DMOS device which includes a ground strap.

BACKGROUND OF THE INVENTION

Power Enhanced Drift Lateral DMOS (EDLDMOS) devices are utilized in a variety of applications. FIG. 1 illustrates a conventional EDLDMOS device 10. During the normal course of using a lateral DMOS device, the gate 12 is biased positively with respect to the source 14 causing a channel to be formed from source 14 across the body 16 to the drift/or drain region. The drain voltage is positive and at equal or higher voltage than the gate voltage. The source 14 and the body 16 are grounded by a diffusion of P+ to the body 16 and a metal interconnect 18 that contacts and shorts the source 14 and body 16 to ground at the point "G" shown in FIG. 1. The reason for the grounding is to prevent snap back voltage (sustaining voltage) occurring at some low voltage below the expected operating voltage of the device. As the gate voltage is increased the current increases. The current flow through the channel region results in impact ionization occurring at the body/drift or body/drain junction. This results in electron/holes being generated. The holes move into the body (pinched and therefore it has high sheet resistance) region and flow across the body toward ground. This constitutes a current flow through the pinched and high resistance Body. The current flow results in a voltage drop along the path to the ground position. This drop is due to the current flow through the high resistance of the pinched Body. In normal operation the end of the body, marked "G", is a distance away from the gate region. This distance we will call "x". The body has a high sheet resistance of "Y" ohms per square from the gate region; therefore the resistance from the gate to the grounded position through the body is xY ohms. The current flow "I" across this xY resistance equates to an IR drop or voltage drop of Z volts. Under normal operation this voltage (Z) is less than +0.6 volts and therefore the NP junction drop is such that the source body junction will not be forward biased locally.

However, as the current is increased in the EDLDMOS there is an increase in the impact ionization and the hole current in the pinched body. At some point in the operation of the LDMOS, as the supply voltage is increased (increases the field at the body/drift or body/drain junction) the hole current in the body due to the increased impact ionization will increase to the point where the drop across the body resistance is such that the NP junction of the Source/Body junction will be forward biased. At this point there is an NPN bipolar transistor structure formed from the source (emitter) to body (base) to drift/drain (collector) region (see FIG. 1) and this device suffers a snap back of voltage similar to the LVCEO of a bipolar transistor. This is due to the high NPN beta amplifying any leakage from the drift (or drain) to body region.

In normal use this snap back (or sustaining) voltage limits the voltage of operation significantly since it occurs like a breakdown at some elevated voltage but snaps back to a much lower voltage. An example would be where the snap back voltage occurs at 30 volts but snaps back to 14 volts. The device therefore is limited to operation below this lower 14 volt level. If one were to monitor the current of the device it would be seen as current increasing dramatically and uncontrollable. This is called the sustaining current and some products state the sustaining current rather than the sustaining voltage as the limiting factor in the operation of the device. The operating current of the device must stay below this Sustaining Current level.

All designs take this into consideration and their data sheet reflects that the use of the device is limited to operation at voltages below the sustaining voltage level or currents below the sustaining current limit. Devices are designed for this to occur at an operating point outside the normal recommended operating voltage, so it is transparent to the user. The key to increasing the operating voltage level of the EDLDMOS is to make the body region (x in FIG. 1) of the device as short and low a resistance as possible to reduce the total resistance to ground and therefore lower the voltage drop across these regions. In this manner any current flow in the body due to impact ionization will not have an IR drop that is high enough to forward bias the source/body junction. This is not readily achievable. The prime method would be to have a short body and a solid ground tied to the source/body at the end of this short body distance. The method I will now discuss will reduce the body length to the shortest level possible (Truncated Source/Body region) while at the same time providing an absolute ground with minimal resistance. These actions will result in a higher Sustaining voltage and higher Sustaining current allowing operation of the EDLDMOS at higher power with all other structures in the device remaining unchanged.

Accordingly, what is needed is a system and method for providing a EDLDMOS device that overcomes the above-identified problems. The approach and method should be cost effective, easy to implement with existing equipment and processes and provide some technical advantages to devices within the semiconductor as well as providing a low sheet resistance interconnect. The invention discussed here addresses such needs.

SUMMARY OF THE INVENTION

A method and system for providing a Truncated Power Enhanced Drift Lateral DMOS device is disclosed. The method and system comprise providing a semiconductor substrate with a plurality of source/body structures thereon. The method and system further comprise providing a slot in the semiconductor substrate between the plurality of source/body structures to provide a truncated source; and providing a metal within the slot to provide a ground strap device.

The method and system in accordance with the present invention offers the following advantages:

1. Increases the snap back (sustaining) voltage when integrated with the EDLDMOS to the point where the device is limited by breakdown voltage of the drain/body—which is a much higher voltage than the normal snap back (sustaining) voltage.

2. Improves the gm of the device for several reasons, one of which is the fact that the device can be operated at higher current (optimum for the design where the gm peaks prior to being limited by snap back voltage) and voltage prior to being limited.

3. Reduces the capacitance of the device—drain to body capacitance is reduced due to the smaller area.

4. Reduces Ron (on resistance) due to the short and robust ground strap providing a lower source resistance than other approaches. The drain metal is also supplied in a slot which reduces any resistance, and therefore loss due to drain resistance. In addition, since the truncation allows the device to operate at higher gate voltages without suffering from limitations of current or voltage, the channel resistance is reduced which significantly reduces its contribution to Ron 5. Increases the frequency of operation due to higher gm and lower capacitance with all other conditions remaining unchanged.

6. Increases the protection against electromigration due to the heavier ground buss and improved heat transfer due to the truncation occurring via metal directly to the Silicon substrate (Ground).

7. Reduces noise that is normally generated at the source/body as it approaches snap back and due to feedback from other circuits or the power supply. Reduces noise also in the power supply lead since it is a lower resistance buss due to the thick metal buried power buss.

8. Reduces the die size since the space required for an interconnect to ground is significantly reduced and there is no isolation diffusion which takes up considerable room. The device is isolated by the ground strap oxidized slot throughout the device design. The power lead is oxide surrounded and therefore can be moved closer to active or passive elements within the die.

9. Increase the net die per wafer due to the smaller die size resulting in more gross die per wafer and reduced loss due to defect density issues due to the reduction in die area. Improves the yield since yield is a function of die area.

10. Improves the heat transfer due to the Truncations metalized slot making intimate contact with the silicon. Heat transfer through silicon is 10 times better than through an oxide and 200 times better than through air.

11. Provides an oxide isolated structure versus a junction isolated structure and the frequency response advantages of this very significant feature. This also results in die size reduction since the oxide truncated metalized slots (Grounds) are used throughout the structure to provide isolation and take up much less room than the normal isolation diffusion type structure.

12. Allows the standard process to remain intact till near the end of the standard process prior to implementation of the truncated slots.

DETAILED DESCRIPTION

The present invention relates generally to a Power Enhanced Drift Lateral DMOS device and more particularly to a Truncated Enhanced Drift Lateral DMOS (EDLDMOS).

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a method and system accordance with the present invention, an interconnect is provided that is disclosed in pending U.S. patent application Ser. No. 10/034,184, entitled "Buried Power Buss for High Current, High Power Semiconductor Devices and a Method for Providing the Same" (2193P) and filed on Dec. 28, 2001 that has the attributes of being able to provide a thick metal buss while only having to deposit pattern and etch much thinner interconnect metal. This application is incorporated herein in its entirety. This is accomplished by providing slots, or trenches that are approximately as wide and deep as the thickness of metal one wants in the power carrying metal busses. The thickness comes from folding the metal in the slots when using a CVD deposition metal system, or by multiple, maskless metal depositions when using a conventional metal sputtering system.

In a preferred embodiment, the Power Buss and the truncation of the Enhanced Drift Lateral DMOS occurs at the end of the processing of the active areas. This is an advantage since it allows the standard processing to remain intact until the very end of the process. For a more detailed description of the features of the present invention, refer now to the following description in conjunction with the accompanying figures.

Ground Strap and Truncated Source/Body

Figure 2:
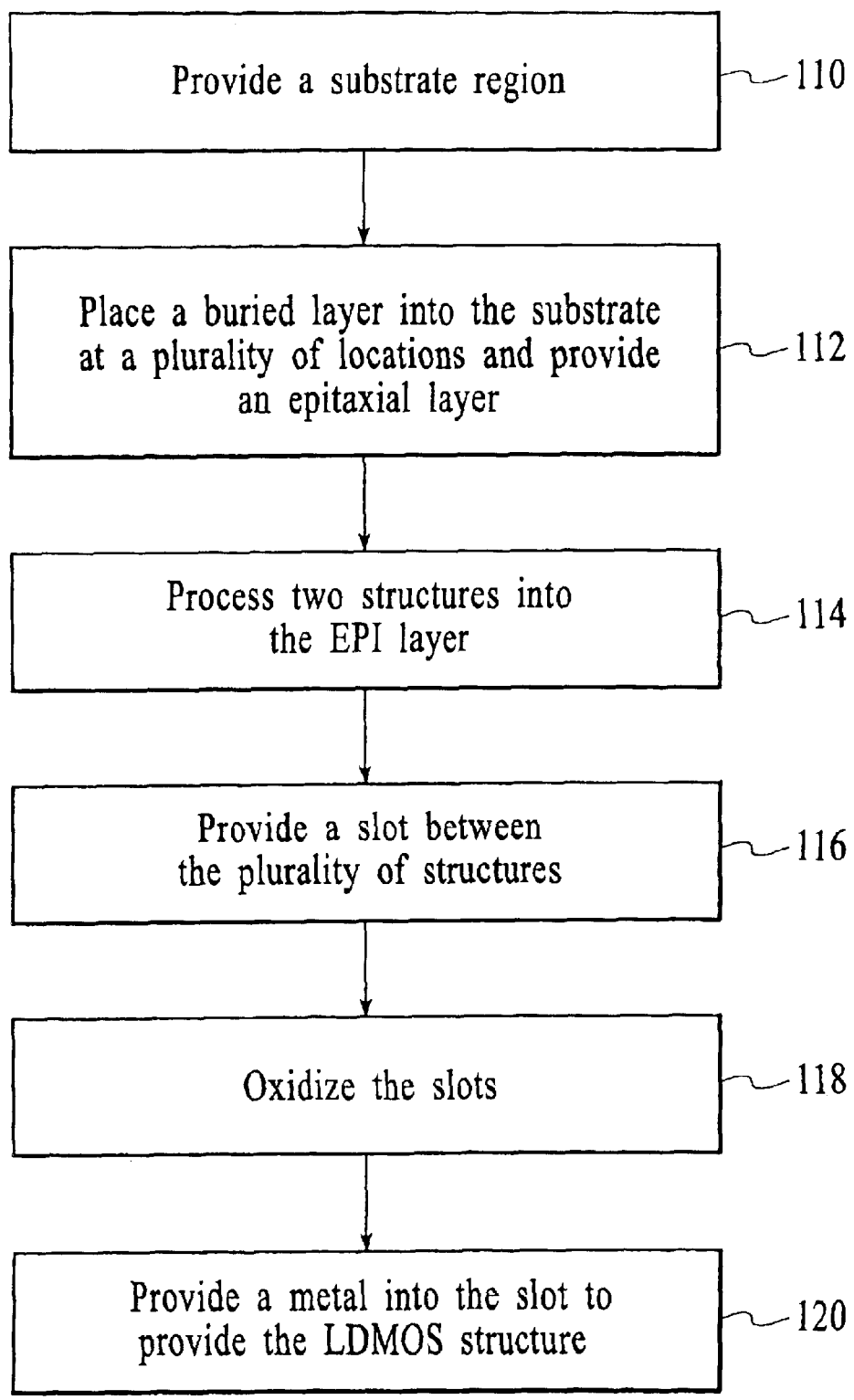
FIG. 2 is a flow chart of a method for providing a truncated LDMOS in accordance with the present invention.
Figure 2A:
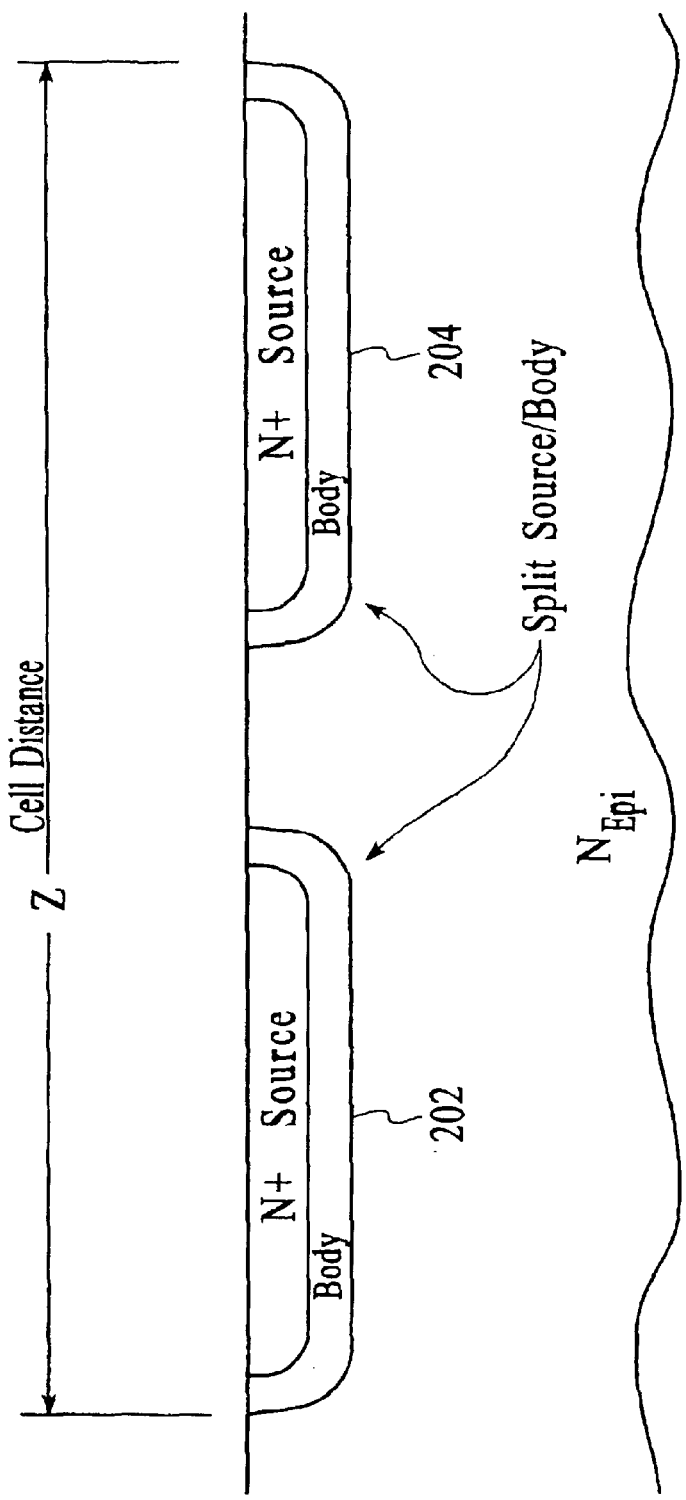
FIGS. 2A and 2B are diagrams of a split source/body as it is being processed.
Figure 2B:
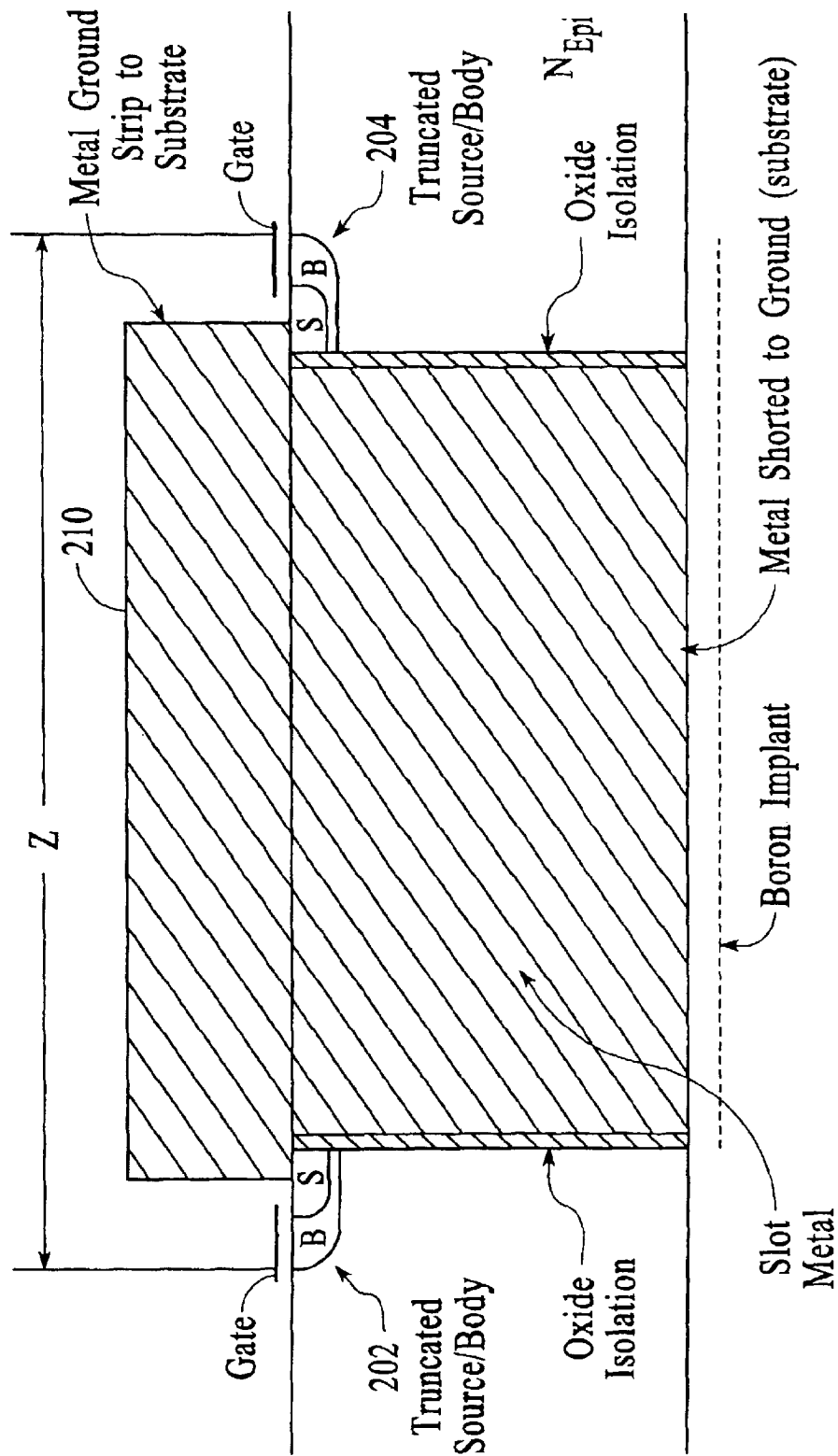

FIG. 2 is a flow chart of a method for providing a truncated LDMOS in accordance with the present invention. FIGS. 2A and 2B are diagrams of a source/body as it is being processed. Referring first to FIG. 2, a substrate region is provided, via step 110. Next a buried layer is placed into the substrate at a plurality of locations and an epitaxial (EPI) layer is provided, via step 112. Thereafter, two source/body structures are processed into the EPI layer to provide the structure shown in FIG. 2A, via step 114 Next, a slot is provided between the plurality of structures, via step 116. This slot is approximately 5 um deep and 5 um wide that extends into the 5–6 um of epitaxial to the P up diffusion (note that there is no N+ buried layer under this portion of the device but it may have a P+ implant to provide an up diffusion during the epitaxial growth, as well as a boron implant after the slot oxidation. Thereafter, the slot is oxidized, via step 118.

Figure 1:
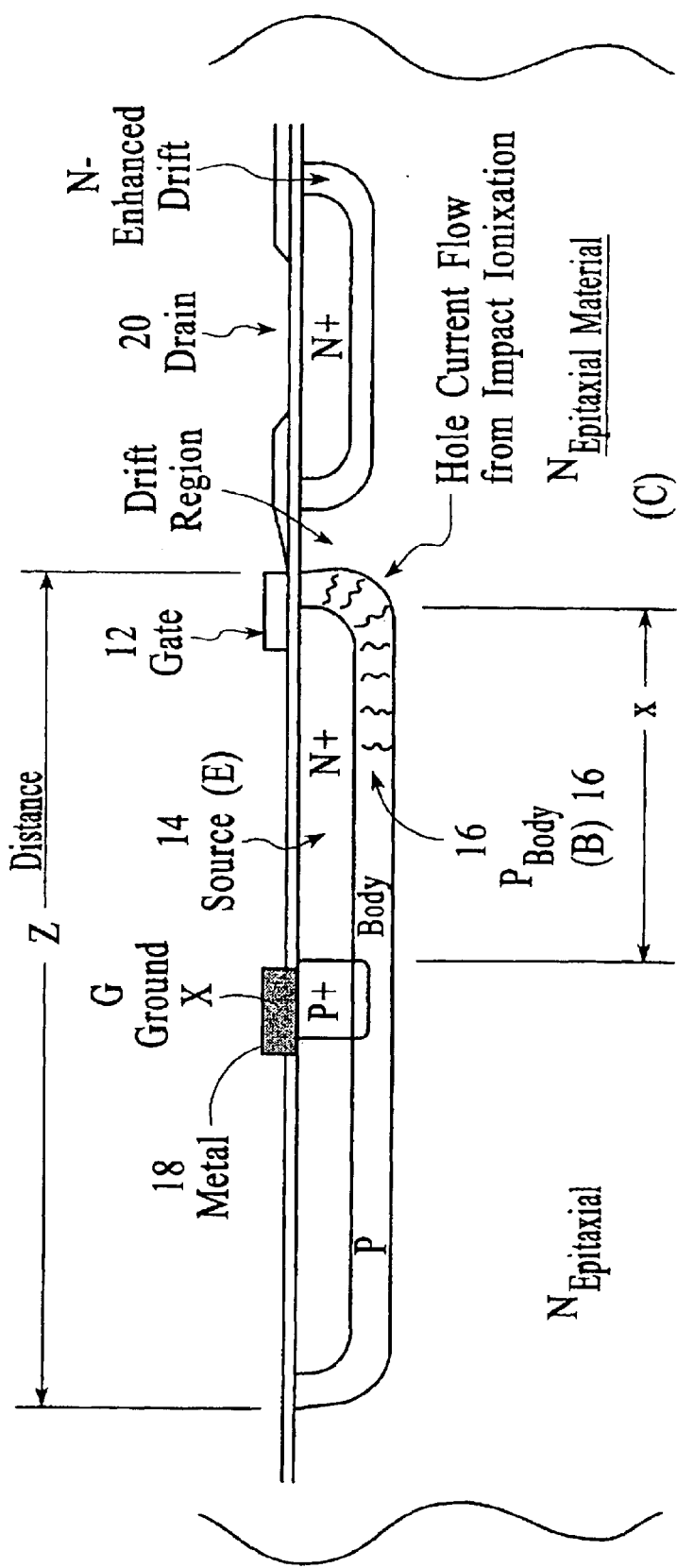
FIG. 1 illustrates a conventional Enhanced Drift Lateral DMOS (EDLDMOS).
Figure 3A:
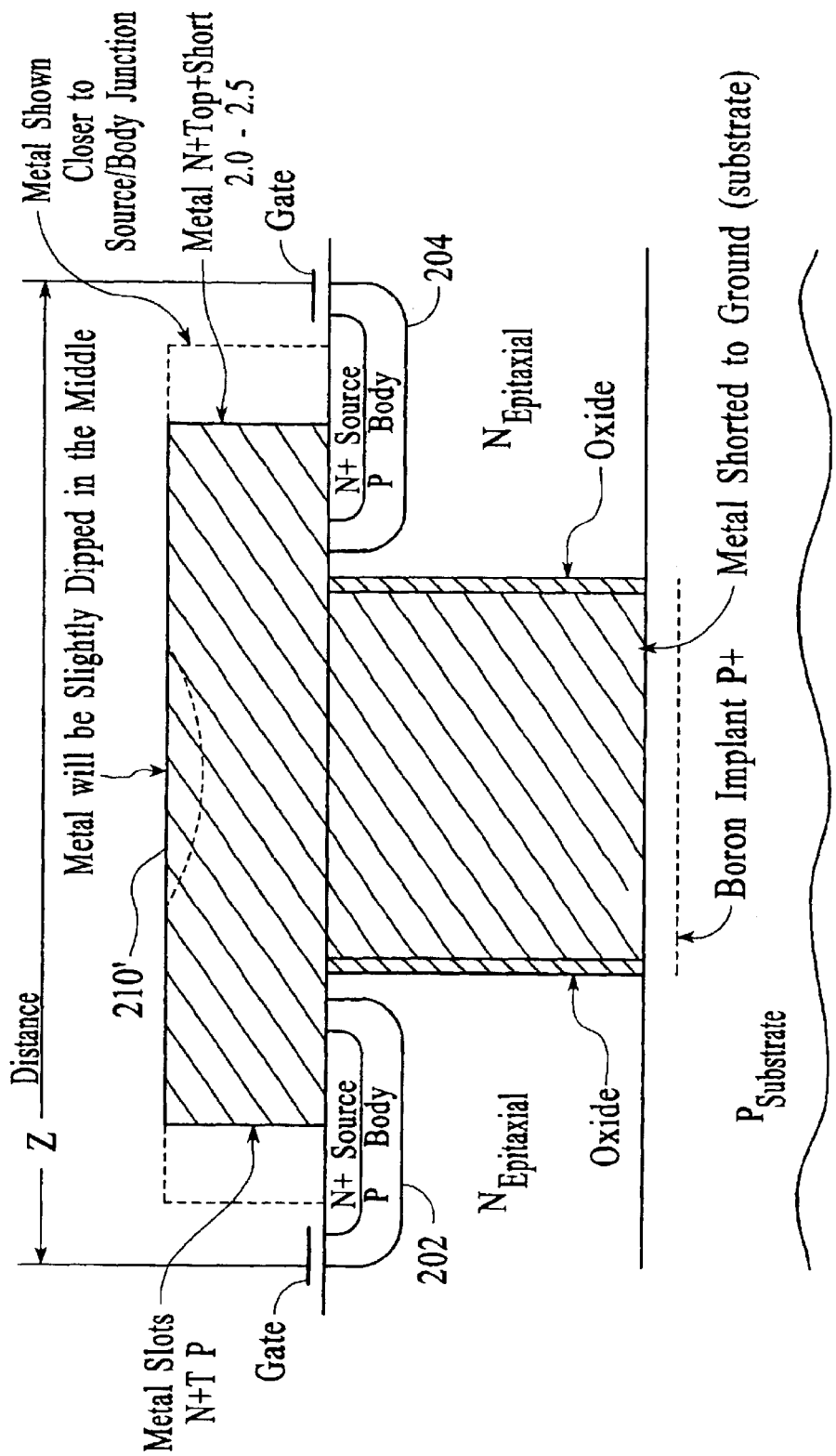
FIG. 3A illustrates metal lying on the horizontal structure of the split source and body.
Figure 3B:
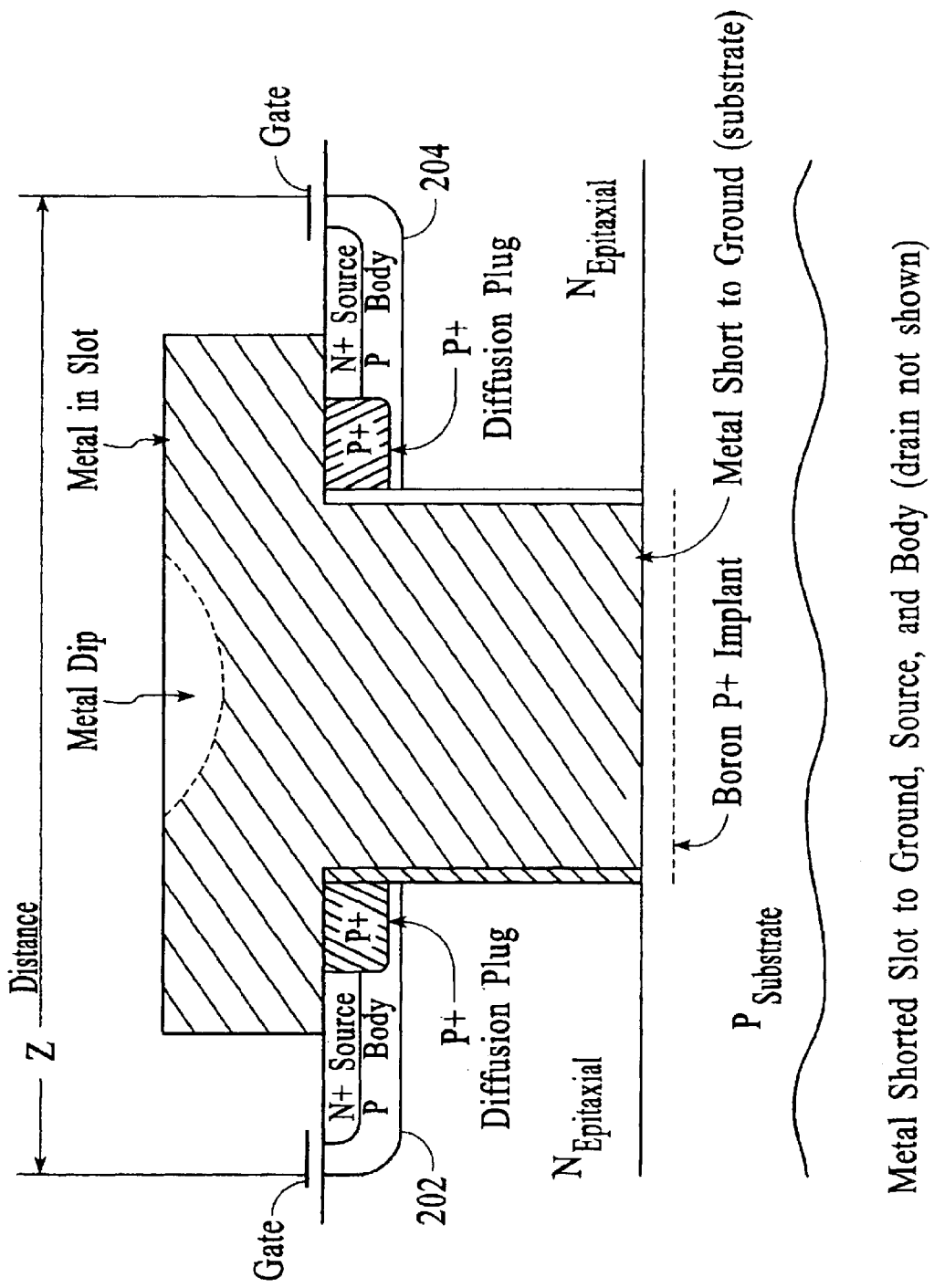
FIG. 3B illustrates metal lying on the horizontal structure of the truncated structures where the Source and Body are not split.

Note that the source/body is processed as normal, however, the source/body is split into two smaller active elements 202 and 204 while maintaining the overall dimension of what was the single source/body. This overall dimension is marked as Z in FIG. 1 which shows the standard approach. Note in FIGS. 2A and 2B that the Z dimension is maintained. Shown in FIGS. 3A and 3B is a Truncated version where a split Source Drain is not used but the standard approach is used for this part of the structure. The only difference from the standard approach shown in FIG. 1 is that the P+ plug diffusion in 3A and 3B is moved much closer to the Source Drain junction. When the metal plug is installed as shown in FIG. 3B, the metal shorts the Plug, Source and Drain much closer to the Source Drain junction. After the P+ implant into the bottom of the slot, the oxide is removed from the bottom of the slot by a dry anisotropic etch. This slot cuts through these two source/body structures presenting the first step toward a truncated source/body that will leave only the outer edges to face the drain structures. It is the intention to only leave enough N+ of the source to provide room for a shorting contact from the ground strap to the inner dimensions of the source/body. By producing this type of structure it eliminates all sources of NPN action that result in snap back (or sustaining current) and increases the voltage operating range.

During the processing of the slots for the ground strap, the power buss, and the slotted sinker (metal 1 in a dual metal approach, and the only metal in the single metal approach) the slot has its side walls oxidized, receives a P+ implant, has the oxide dry etched from the bottom of the slot. Finally, a metal is provided into the slot to provide the LDMOS structure, via step 20. The slot is filled with metal resulting in the ground strap structure 210 shown in FIGS. 2B, 3A and 3B contacting the P substrate/ground. This provides a robust metal strap that grounds the truncated source to the body and the substrate. As we shall see later it also provides the oxide isolation (oxide on walls of the slot isolates this ground metal from the active circuit) from one device to another and eliminates the need for a long and high temperature isolation diffusion and its resulting junction isolation. In order to ensure that there is good shorting from source to body, the structure was made up of the split double source/drain structure shown in FIG. 3A that doesn't require the processing of a P plug diffusion as shown in the standard approach in FIG. 1. In addition, one can follow the standard non split version of the cell by carrying the P+ plug diffusion wider and closer to the Source Drain junction as shown in FIG. 3B. This approach requires the P+ plug diffusion but it is able to make a better ohmic contact between the Metal Buried Power Buss and the Source/Drain/P+Plug.

To give a better insight to how the source is shorted to body, the structure is redrawn as shown in FIG. 3. This figure shows the metal 210 laying on the horizontal structure of the source and body 102 and 104. This approach eliminates the P+ plug diffusion of the standard approach and eliminates the isolation diffusion in the process and therefore results in much less room taken up in the power FET as well as in the total area of the chip. This also reduces the capacitance compared to the junction isolation approach. This ground strap has a cross section of 25 square microns while only taking up 5 um of horizontal space on the surface, thus reducing the size of chip required to carry this amount of current. This is a very robust ground strap.

This ground strap integrated into the truncated source/body provides an EDLDMOS with greatly improved performance. Although the ground strap is shown in this configuration it is used throughout the integrated circuit wherever isolation is required and/or a robust ground is needed for high current. This oxide isolated ground results in reduced capacitance versus the standard junction isolated process and is utilized throughout the design. The extra added feature of this ground strap is the ability it presents when combined with the truncated source in reducing any impact ionization current from flowing in the body and developing enough forward bias of the source/body junction that is not shorted.

This method of providing a robust metal cross-section has an added advantage when used with the polishing capability available in the industry. This provides a thick/wide metal that is almost planar with the rest of the metal surface and should be used to connect all power elements together. It provides enough current carrying capability to eliminate the need for a thick second metal in most cases. Since a thick metal buss and thinner interconnect is supplied as part of the buried power buss process it automatically provides a dual metal structure with single metal patterning and etching. Therefore there is normally no need for an additional metal; i.e., this method supplies a thick buried metal and a thin interconnect metal that is integral with the buried metal. High currents are carried on the buried metal portion and low signal currents are supplied on the thin upper metal layer. The Truncated Enhanced Drift Lateral DMOS with the buried slot metal and normal interconnect metal provides a low resistance Source to ground and a low resistance Drain structure. Overall this is a low Ron X Area structure. A double cell structure is shown but this can be expanded to a multiple cell structure with many advantages. One advantage relates to the fact that a Ground wire does not have to be led into the multiple cell structure since the Ground is supplied vertically via the substrate and the metal plug of the Truncated structure. However, where additional metal is needed, it can be provided since the structure as described results in a flat surface ready to proceed with an additional metal or layers. This provides a finished surface that can receive plasma enhanced depositions of dielectric followed by spin on glass (SOG), planarizing and additional metal without concern for crossing over this structure since it is available with no added extension above the normal surface and metal crossing will not suffer breakage.

The current carrying capability is dramatic for the surface area used. In addition, if additional metal is required for carrying heavier loads a double slot in parallel can be produced to provide double this cross sectional area thus giving 50 square microns of metal and only using approximately 13 um of width (leaving 3 um between slots). Since this strap is tied to the P substrate at many points in the device it provides a method of establishing an equal-potential grounded shield. This will result in less cross-talk, less coupling between circuits, less ground noise and overall better performance. The slot cuts between the twin source/body structure and provides two source/bodies so that the ground strap services two stripes of EDLDMOS in parallel as shown in FIG. 3A. The same is true for the structure shown in FIG. 3B. It is obvious that this approach will provide a very low resistance Ron contributor to the device. This is also an advantage when considering electro-migration. We presently have current limits to prevent electro-migration in our design rules based on one micron of thickness and 5 um of width.

This approach provides 5 to 10 times that thickness and for the same 5 um of width it provides at greater than 5 to 10 times the current before the onset of electro-migration. Due to the added improvement in heat transfer the metal will be able to carry one to two orders of magnitude of current before electro-migration limits this function. In this case the width is determined by how wide one makes this ground strap in the given design. This would become more important in high current applications. It is obvious that the size of these inactive elements can become a factor depending on the size of the power FET relative to the size of the remaining chip circuitry and the percent taken up by these inactive elements. The method discussed here results in a reduction in size of the inactive elements (interconnects) for the same power dissipation.

Advantages

There are several advantages to the Truncated Power Enhanced Lateral Drift DMOS device in accordance with the present invention:

1. Increases the snap back (sustaining) voltage when integrated with the EDLDMOS to the point where the device is limited by breakdown voltage of the drain/body—which is a much higher voltage than the normal snap back (sustaining) voltage.

2. Improves the gm of the device for several reasons, one of which is the fact that the device can be operated at higher current (optimum for the design where the gm peaks prior to being limited by snap back voltage) and voltage prior to being limited.

3. Reduces the capacitance of the device—drain to body capacitance is reduced due to the smaller area.

4. Reduces Ron due to the short and robust ground strap providing a lower source resistance than other approaches. The drain metal is supplied in a slot which reduces any loss due to drain resistance.

5. Increases the frequency of operation due to higher gm and lower capacitance.

6. Increases the protection against electro-migration due to the heavier ground buss and improved heat transfer.

7. Reduces noise that is normally generated at the source/body as it approaches snap back and due to feedback from other circuits or the power supply. Reduces noise also in the power supply lead since it is a lower resistance buss due to the thick metal buried power buss.

8. Reduces the die size since there is space required for an interconnect to ground and there is no isolation diffusion which takes up considerable room. The device is isolated by the ground strap throughout the device design. The power lead is oxide surrounded and therefore can be moved closer to active or passive elements within the die.

9. Increase the net die per wafer due to the smaller die size for a given function resulting in more gross die per wafer and reduced loss due to defect density issues due to the reduction in die size. Improves the yield since yield is an inverse function of die size.

10. Improves the heat transfer due to the intimate contact with the silicon. Heat transfer through silicon is 10 times better than through an oxide and 200 times better than through air.

11. Provides an oxide isolated structure versus a junction isolated structure and the frequency response advantages of this very significant feature. This also results in die size reduction since the oxide isolated grounds throughout the structure take up much less room than the normal isolation diffusion type structure.

12. Allows the standard process to remain intact till near the end of the standard process prior to implementation.

13. Provides a dual metal structure with single metal patterning and etching.

14. Provides dual metal where both metals are thick. This has not proven to be possible with other approaches since a thick metal as first metal places requirements on the second metal processing to be too difficult to produce. This is due to the fact that the second metal cannot cross over the thick first metal and the dielectric separating the second metal from the first without the metal breaking over the large steps.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A power enhanced lateral DMOS device comprising:
   a semiconductor substrate, the semiconductor substrate including a plurality of source/body structures thereon; and
   a slot on the semiconductor substrate between the plurality of source/body structures to provide a truncated source, the slot oxidized, and
   a metal within the slot to provide a ground strap shorting the source to body to ground.

2. The LDMOS device of claim 1 wherein the semiconductor substrate comprises:
   a substrate region; and a buried layer, or Boron Up Diffusion where required and
   an epitaxial (EPI) layer over the substrate region, wherein the source/body structures are provided in the EPI layer.

3. The LDMOS device of claim 1 wherein the truncated source and the ground strap shortens the path from the source/body junction to ground and reduces voltage drop that occurs as a result of current flow induced by impact ionization in the source/body junction.

4. The LDMOS device of claim 1 wherein snap back voltage is enhanced to a higher breakdown voltage due to reduced NPN action in the ground/body/epitaxial parasitic NPN transistor.

5. The LDMOS device of claim 1 wherein the structure is oxide isolated.

6. The LDMOS device of claim 1 wherein the metal comprises a first and second metal that can be provided with single metal patterning and etching for the interconnect.

7. The LDMOS device of claim 6 wherein the first and second metals can be thick as compared to standard approaches which would result in metal breakage.

* * * * *